(12) United States Patent
Chiu (10) Patent No.: US 12,085,522 B2
(45) Date of Patent: Sep. 10, 2024

(54) SAMPLE ROTATION SYSTEM AND METHOD

(71) Applicant: CHANGXIN MEMORY TECHNOLOGIES, INC., Hefei (CN)

(72) Inventor: Kuojung Chiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 373 days.

(21) Appl. No.: 17/648,304

(22) Filed: Jan. 19, 2022

(65) Prior Publication Data

US 2023/0012319 A1  Jan. 12, 2023

Related U.S. Application Data

(63) Continuation of application No. PCT/CN2021/108465, filed on Jul. 26, 2021.

(30) Foreign Application Priority Data

Jul. 8, 2021 (CN) ......................... 202110776194.4

(51) Int. Cl.
  *G01N 23/2251* (2018.01)
  *G01N 1/28* (2006.01)

(52) U.S. Cl.
  CPC ......... *G01N 23/2251* (2013.01); *G01N 1/286* (2013.01); *G01N 2001/2873* (2013.01); *G01N 2223/309* (2013.01)

(58) Field of Classification Search
  None
  See application file for complete search history.

(56) References Cited

U.S. PATENT DOCUMENTS

| | | | | |
|---|---|---|---|---|
| 8,569,719 B2 * | 10/2013 | Tomimatsu | ............... | G01N 1/28 250/311 |
| 10,056,227 B2 | 8/2018 | Oonishi et al. | | |
| 11,282,672 B2 | 3/2022 | Suzuki et al. | | |
| 2008/0073535 A1 | 3/2008 | Hong et al. | | |
| 2012/0273692 A1 * | 11/2012 | Tokuda | ..................... | H04L 9/40 250/400 |

(Continued)

FOREIGN PATENT DOCUMENTS

| | | | | |
|---|---|---|---|---|
| CN | 107204268 A | | 9/2017 | |
| CN | 109075003 A | * | 12/2018 | ............... G01N 1/28 |

(Continued)

OTHER PUBLICATIONS

International Search Report cited in PCT/CN2021/108465 mailed Mar. 28, 2022, 10 pages.

*Primary Examiner* — Andrew Smyth
(74) *Attorney, Agent, or Firm* — Kilpatrick Townsend & Stockton LLP (57) ABSTRACT

The present disclosure provides a sample rotation system and method. The sample rotation system includes a rotation device, and the rotation device includes: a first carrier connected to a sample; a drive portion connected to the first carrier, wherein the drive portion is configured to drive the first carrier to rotate; and the first carrier drives the sample to rotate from an initial position to a target position; an acquisition device, configured to acquire a rotation state of the sample; and a control unit, electrically connected to the drive portion, and configured to control operation of the drive portion.

15 Claims, 7 Drawing Sheets

(56) References Cited

U.S. PATENT DOCUMENTS

| | | | | |
|---|---|---|---|---|
| 2013/0146765 A1* | 6/2013 | Kitayama | ........... | H01J 37/3056 |
| | | | | 250/311 |
| 2015/0214004 A1 | 7/2015 | Pavia | | |
| 2019/0122853 A1* | 4/2019 | Ikeuchi | .................... | G01N 1/28 |
| 2019/0293578 A1 | 9/2019 | Gellineau | | |
| 2021/0407761 A1* | 12/2021 | Maeda | .................... | H01J 37/22 |

FOREIGN PATENT DOCUMENTS

| | | | | |
|---|---|---|---|---|
| CN | 109709116 A | 5/2019 | | |
| CN | 109813586 A | 5/2019 | | |
| CN | 110246735 A | 9/2019 | | |
| CN | 111081515 A | 4/2020 | | |
| CN | 111819675 A | 10/2020 | | |
| CN | 112198174 A | 1/2021 | | |
| JP | 6549313 B2 * | 7/2019 | ............... | G01N 1/28 |

\* cited by examiner

SAMPLE ROTATION SYSTEM AND METHOD

CROSS-REFERENCE TO RELATED APPLICATIONS

This is a continuation of International Application No. PCT/CN2021/108465, filed on Jul. 26, 2021, which claims the priority to Chinese Patent Application No. 202110776194.4, titled "SAMPLE ROTATION SYSTEM AND METHOD" and filed on Jul. 8, 2021. The entire contents of International Application No. PCT/CN2021/108465 and Chinese Patent Application No. 202110776194.4 are incorporated herein by reference.

TECHNICAL FIELD

The present disclosure relates to, but is not limited to, a sample rotation system and method.

BACKGROUND

At present, in the field of semiconductor manufacturing technology, when analyzing the interior of a semiconductor device, it is necessary to prepare a sample and configure a transmission electron microscope (TEM) to observe the internal microstructure of the sample, so as to test and analyze the sample.

When a sample slice is observed and tested, the TEM uses a dual beam focused ion beam (Dual beam FIB). If a same surface of the sample is uneven or atomic numbers of species on a cross-section differs largely, a curtaining effect is caused, which will affect the accuracy of test results.

SUMMARY

An overview of the subject matter detailed in the present disclosure is provided below, which is not intended to limit the protection scope of the claims.

The present disclosure provides a sample rotation system and method.

A first aspect of the present disclosure provides a sample rotation system, including:
a rotation device, the rotation device including:
a first carrier, configured to be connected to a sample;
a drive portion, connected to the first carrier, wherein the drive portion is configured to drive the first carrier to rotate, and the first carrier drives the sample to rotate from an initial position to a target position;
an acquisition device, configured to acquire a rotation state of the sample; and
a control unit, electrically connected to the drive portion, and configured to control operation of the drive portion.

A second aspect of present disclosure provides a sample rotation method, including:
controlling a first carrier to receive a sample;
driving the first carrier to rotate, the first carrier driving the sample to rotate from an initial position to a target position;
acquiring a rotation state of the sample; and
determining, based on the rotation state of the sample, whether the sample has been rotated to the target position.

Other aspects of the present disclosure are understandable upon reading and understanding of the drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

The thickness of a sample affects imaging quality of the sample test through the TEM, and a satisfactory TEM observation effect can be obtained with a suitable sample thickness.

In an example, the sample is adhered to a substrate, and after the substrate is polished and removed, the sample is prepared. This method is time-consuming and site-specific cutting cannot be performed.

In another example, overcutting is used to process the sample to obtain a larger observation area. However, this method is time-consuming and has a low success rate. After the overcutting, a lower structure of the sample still cannot be effectively observed due to the curtaining effect. Consequently, accurate observation results cannot be obtained.

The present disclosure provides a sample rotation system. The sample rotation system includes a rotation device. The rotation device includes a first carrier, a drive portion, an acquisition device, and a control unit. The first carrier is connected to a sample, the drive portion is connected to the first carrier, the drive portion is configured to drive the first carrier to rotate, the first carrier drives the sample to rotate from an initial position to a target position, and the acquisition device is configured to acquire a rotation state of the sample. The control unit is electrically connected to the drive portion, and is configured to control operation of the drive portion. In the present disclosure, the drive portion drives the first carrier to rotate, and the first carrier drives the sample to rotate to the target position. This realizes rapid turnover of the sample and saves time. In addition, rotating the sample to the target position facilitates the undercutting process, and effectively improves the success rate and efficiency of undercutting.

Figure 1:
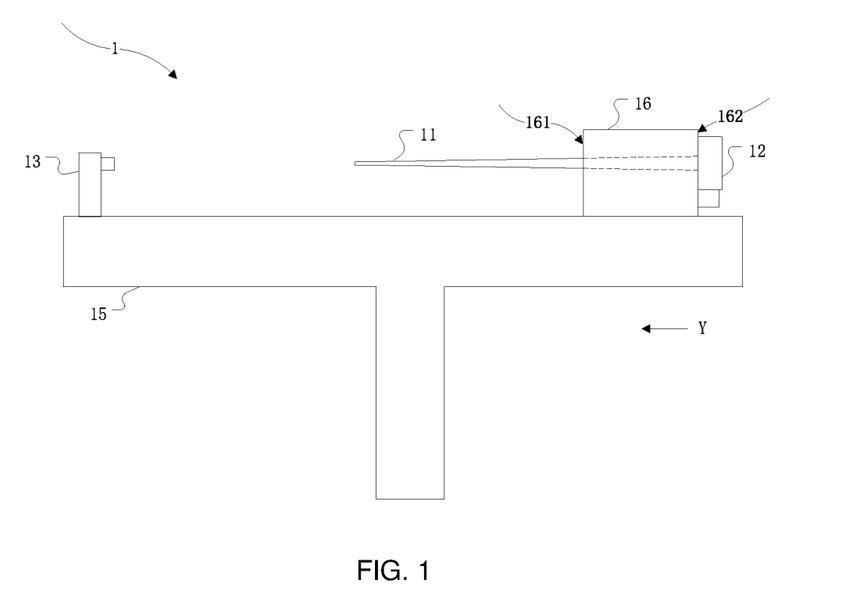
FIG. 1 is a schematic structural diagram of a rotation device according to an exemplary embodiment.

As shown in FIG. 1, FIG. 1 is a schematic diagram of a rotation device according to an exemplary embodiment of the present disclosure.

Figure 5:
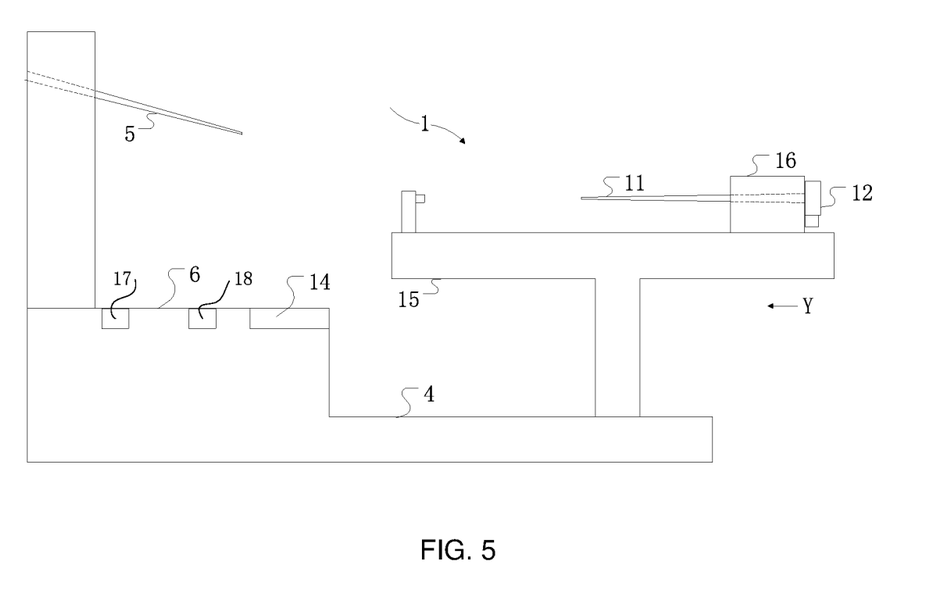
FIG. 5 is a schematic structural diagram of a sample rotation system according to an exemplary embodiment.

A sample rotation system includes a rotation device 1, and the rotation device 1 includes a first carrier 11, a drive portion 12, an acquisition device 13, and a control unit 14 (refer to FIG. 5).

The first carrier 11 is connected to a sample. The sample may be a silicon substrate. In an installed state, for example, a side of the sample to be observed faces downward. The first carrier 11 may be a first probe, and the first probe may be made of a tungsten material, such that the first carrier 11 has the characteristics such as high hardness, wear resistance, high strength and toughness, heat resistance and corrosion resistance.

A free end of the first carrier 11 is adhesively connected to the sample, and the free end is in the shape of a tip. A deposition process may be adopted to adhesively connect the first carrier 11 to the sample.

The drive portion 12 is connected to the first carrier 11, and a fixed end of the first carrier 11 is installed to the drive portion 12. The drive portion 12 is configured to drive the first carrier 11 to rotate, and the first carrier 11 drives the sample to rotate from an initial position to a target position, such that a side of the sample to be observed faces upward, facilitating undercutting of the sample. The undercut sample has a larger observation area, which meets the basic requirements of observation and test, and facilitates partial observation of the sample.

The acquisition device 13 is configured to acquire a rotation state of the sample, to determine whether a current position of the sample is the target position, so as to avoid deviation of the sample rotation and inaccuracy of the undercutting. If the sample has not been rotated to the target position, timely adjustment may be made to facilitate the undercutting process.

The control unit 14 is electrically connected to the drive portion 12, and is configured to control operation of the drive portion 12. The first carrier 11 rotates synchronously with the drive portion 12, and drives the sample to rotate, realizing the rotation of the sample. The control unit 14 controls the operation of the drive portion 12 to realize automation of the sample rotation system and ensure precise rotation.

The drive portion 12 drives the first carrier 11 to rotate, and the first carrier 11 drives the sample to rotate to the target position. This reduces the time of the undercutting process, ensures the accuracy of the undercutting process, and improves the efficiency and success rate of the undercutting process. The undercut sample is partially observed to test and analyze the sample.

It should be noted here that the above-mentioned terms related to orientations such as top and bottom are intended to interpret this embodiment on the basis of those shown in the figure, rather than to limit the present application.

As shown in FIG. 1, a sample rotation system includes a rotation device 1, and the rotation device 1 includes a first carrier 11, a drive portion 12, an acquisition device 13 and a control unit 14 (refer to FIG. 5). The above-mentioned connection modes and functions are described in detail in the above embodiment, and will not be repeated here.

The first carrier 11 drives the sample to rotate from the initial position to the target position, and there is a preset included angle between the initial position and the target position. The preset included angle ranges between 0° and 180°.

When the sample is undercut, an FIB is used. The FIB can be widely used in small-scale structure analysis, cross-section cutting, TEM sample preparation, and so on. The FIB is an ion beam generated by a liquid metal Ga+ ion source, which is accelerated and focused by an ion gun and irradiated on the surface of the sample. The surface atoms are stripped by a strong current ion beam to complete micron and nanometer-scale surface topography processing through beams.

The FIB may be a single beam FIB and a dual-beam FIB. The single beam FIB is an FIB with only the ion beam, and the ion beam is mainly used for sample cross-section processing. The dual-beam FIB includes an ion beam and an electron beam. There is an included angle of 52° between the electron beam and the ion beam. When the ion beam is used for cross-section processing, the electron beam can be used for topography observation and fine analysis.

In an example, the sample is in a plate shape. When the sample is placed in a horizontal direction (refer to the Y axis shown in FIG. 1), and a side with the curtaining effect is placed horizontally downward, the first carrier 11 drives the sample to rotate by 180° relative to the initial position to the target position, revealing the side of the sample with the curtaining effect, such that the FIB can process the cross-section of the sample, to ensure the accuracy of the sample undercutting.

In another example, the sample is in a special shape. A plane of the sample processing cross-section has an included angle of 10° with the horizontal direction (refer to the Y axis shown in FIG. 1), and the first carrier 11 drives the sample to rotate by 170° relative to the initial position, to realize turnover of the sample, such that the FIB can process the cross-section of the sample, to ensure the accuracy of the sample undercutting.

Figure 2:
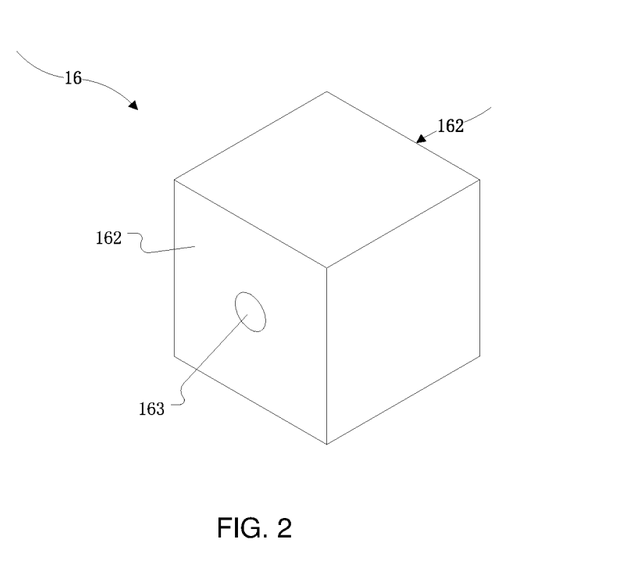
FIG. 2 is a schematic structural diagram of a limiting portion according to an exemplary embodiment.

As shown in FIG. 1 and FIG. 2, FIG. 2 is a schematic structural diagram of a limiting portion according to an exemplary embodiment.

A sample rotation system includes a rotation device 1, and the rotation device 1 includes a first carrier 11, a drive portion 12, an acquisition device 13, and a control unit 14 (refer to FIG. 5). The above-mentioned connection modes and functions are described in detail in the above embodiment, and will not be repeated here.

The rotation device 1 further includes a stage 15, the drive portion 12 is installed on the stage 15, the first carrier 11 is installed on the stage 15, and a fixed end of the first carrier 11 is connected to the drive portion 12. The drive portion 12 and the first carrier 11 are installed on the stage 15, to improve the stability of the rotation device 1 and ensure the rotation state of the sample, so as to avoid rotation errors.

The rotation device 1 further includes a limiting portion 16, the limiting portion 16 may be a limiting block, and the limiting block is fixedly disposed on an upper surface of the stage 15. The drive portion 12 is installed on the stage 15 through the limiting portion 16, and the fixed end of the first carrier 11 penetrates the limiting portion 16 to be connected to the drive portion 12.

The limiting portion 16 includes a first side surface 161 and a second side surface 162, and the limiting portion 16 is provided with a through hole 163 penetrating the first side surface 161 and the second side surface 162. The drive portion 12 is fixedly installed on the second side surface 162, and the fixed end of the first carrier 11 rotatably passes through the through hole 163 from the first side surface 161, and is fixedly connected to the drive portion 12.

The fixed end of the first carrier 11 is fixedly connected to the drive portion 12, to improve the reliability of the connection between the first carrier 11 and the drive portion 12 and to ensure that the drive portion 12 can drive the first carrier 11 to rotate.

As shown in FIG. 1, a sample rotation system includes a rotation device 1, and the rotation device 1 includes a first carrier 11, a drive portion 12, an acquisition device 13 and a control unit 14 (refer to FIG. 5). The above-mentioned connection modes and functions are described in detail in the above embodiment, and will not be repeated here.

The sample rotation system further includes a processing device 17 (although the processing device is positioned as shown in FIG. 5, it can be placed in any position where the sample rotation system can realize the corresponding function). The processing device 17 is electrically connected to the control unit 14 and the acquisition device 13 separately. The processing device 17 is configured to be communicatively connected to the acquisition device 13, to receive image information from the acquisition device 13, and perform corresponding processing based on the image information.

The acquisition device 13 includes an image acquisition unit, the image acquisition unit is electrically connected to the processing device 17, and the image acquisition unit is configured to acquire image information of a position of the sample. The image acquisition unit may include a camera module. The camera module takes pictures of the sample, obtains the image information of the position of the sample, determines a current position of the sample, and transmits the image information to the processing device 17. The processing device 17 analyzes the image information to determine whether the sample has been rotated to the target position. If it is determined that the sample has been rotated to the target position, the rotation action ends. If it is determined that the sample has not been rotated to the target position, the processing device 17 may send a corresponding instruction to the control unit 14. The control unit 14 drives the drive portion 12 according to the instruction, to adjust the position of the sample in time, so as to ensure that the sample is rotated to the target position.

Alternatively, the processing device 17 may determine a difference between the current position and the target position of the sample, and directly transmit the difference to the control unit 14. The control unit 14 drives the drive portion 12 based on the difference, and the drive portion 12 drives the first carrier 11 to rotate, such that the sample rotates with the first carrier 11 to the target position.

Figure 3:
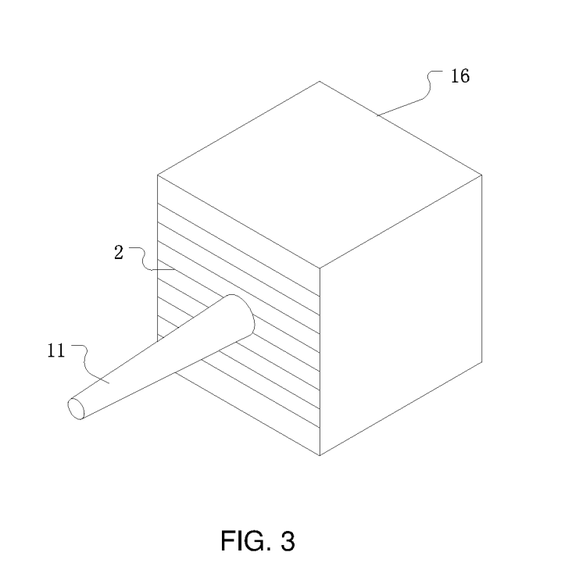
FIG. 3 is a schematic structural diagram of a reference body according to an exemplary embodiment.

As shown in FIG. 1 and FIG. 3, FIG. 3 is a schematic structural diagram of a reference body according to an exemplary embodiment.

A sample rotation system includes a rotation device 1, and the rotation device 1 includes a first carrier 11, a drive portion 12, an acquisition device 13, and a control unit 14 (refer to FIG. 5). The above-mentioned connection modes and functions are described in detail in the above embodiment, and will not be repeated here.

The sample rotation system further includes a reference body 2, the reference body 2 is a static reference body, the reference body 2 is disposed at a target position, and the first carrier 11 is configured to move relative to the reference body 2. The sample may be in a regular plate shape, and is compared with the reference body 2, to determine whether the sample has been rotated to the target position. An image acquisition unit acquires image information of a relative position between the sample and the reference body 2. The image information includes a current position of the sample and a current position of the reference body 2, and a relative position between the sample and the reference body 2 is obtained through comparison. If the image information indicates that the sample overlaps the reference body 2, it is determined that the sample has been rotated to the target position. If the image information indicates that the sample is staggered with the reference body 2, it is determined that the sample has not been rotated to the target position and needs to be adjusted.

The reference body 2 is disposed, such that the image acquisition unit acquires the image information of the relative position between the sample and the reference body 2. The image information is used to directly determine the current position of the sample in a regular shape with reference to the reference body 2. The determining method is relatively simple and intuitive, and the processing device 17 can quickly determine the current position of the sample and draw conclusions, thereby reducing the determining time and improving the efficiency.

Figure 4:
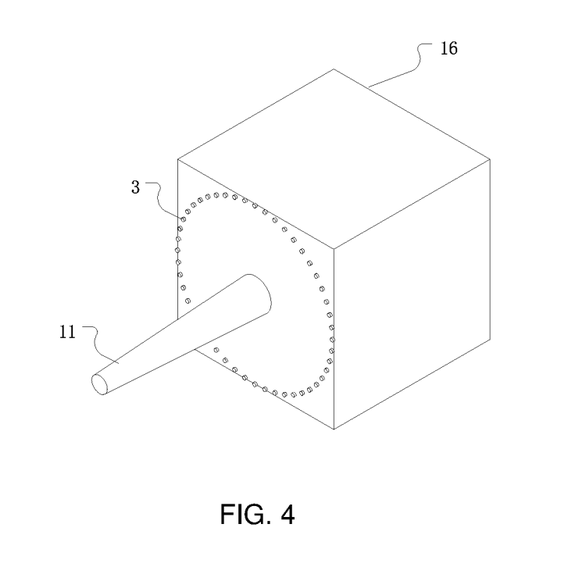
FIG. 4 is a schematic structural diagram of a reference unit according to an exemplary embodiment.

As shown in FIG. 1 and FIG. 4, FIG. 4 is a schematic structural diagram of a reference unit according to an exemplary embodiment.

A sample rotation system includes a rotation device 1, and the rotation device 1 includes a first carrier 11, a drive portion 12, an acquisition device 13, and a control unit 14 (refer to FIG. 5). The above-mentioned connection modes and functions are described in detail in the above embodiment, and will not be repeated here.

The sample rotation system further includes a reference unit 3, the reference unit 3 is communicatively connected to a processing device 17, and the reference unit 3 includes a multiple of reference marking points. Each reference point corresponds to one reference value. The reference values are pre-stored in the reference unit, and there is a mapping relationship between the reference points and the reference values.

The sample may be in a special shape. After the sample is rotated, the acquisition device 13 acquires a current position of the sample, to determine a reference point corresponding to the current position of the sample, and determine a reference value corresponding to the reference point. The processing device 17 compares the corresponding reference value with a reference value of a target position, to determine a deviation. If the deviation is within a preset range, it is determined that the sample has been rotated to the target position. If the deviation exceeds the preset range, it is determined that the sample has not been rotated to the target position and needs to be adjusted. A distance between the sample and the target position is determined based on a difference between the deviation and the preset range.

The reference unit 3 is disposed, the multiple reference points are used as the reference datum, and the reference points have corresponding reference values. In this case, after the current position of the sample is accurately determined, the deviation between the current position and the target position of the sample is determined, and automatic adjustment is performed to realize the automation of the sample rotation system.

As shown in FIG. 5, FIG. 5 is a schematic diagram of a sample rotation system according to an exemplary embodiment of the present disclosure.

The sample rotation system includes a rotation device 1, a machine table 6, and a transfer mechanism 4. The machine table 6 is a machine table with a dual-beam FIB, such that an FIB and an electron beam can irradiate samples.

The transfer mechanism 4 is installed on the machine table 6, and the transfer mechanism 4 is electrically connected to a control unit 14. The control unit 14 is configured to drive the transfer mechanism 4, and the transfer mechanism 4 drives the rotation device 1 to move to a predetermined position on the machine table 6. The sample is disposed on the machine table 6, the transfer mechanism 4 moves the rotation device 1 to the predetermined position on the machine table 6, the machine table 6 transfers the sample to the rotation device 1, and the rotation device 1 rotates the sample. The details of rotating the sample by the rotation device 1 have been described in detail in the foregoing embodiments, and will not be repeated here.

The sample rotation system further includes a second carrier 5, the second carrier 5 is installed on the machine table 6, and the second carrier 5 is configured to be connected to the sample. The second carrier 5 may be a second probe, and the second probe may be made of a tungsten material, such that the second carrier 5 has the characteristics such as high hardness, wear resistance, high strength and toughness, heat resistance and corrosion resistance.

A free end of the second carrier 5 is adhesively connected to the sample, and the free end is in the shape of a tip. A deposition process may be adopted to adhesively connect the second carrier 5 to the sample. The second carrier 5 carries the sample to the first carrier 11, to connect the sample to the first carrier 11 and separate the sample from the second carrier 5, thereby realizing the transfer of the sample. During the undercutting process, the undercut cross-section finally presented is an oblique or flat cross-section, and the FIB has an incident angle relative to the sample, such that a beam optical axis of the FIB has a preset included angle with the sample. In order to avoid the deviation of the incident angle of the FIB, an extension direction of a central axis of the second carrier 5 is parallel to the beam optical axis of the FIB, such that a same preset included angle is formed between the second carrier 5 and the sample.

The transfer mechanism 4 moves the rotation device 1 to the predetermined position on the machine table 6, and the predetermined position may be near the free end of the second carrier 5, to facilitate transferring the sample between the second carrier 5 and the first carrier 11. After the rotation device 1 completes rotation of the sample, the first carrier 11 moves the sample back to the second carrier 5, to process the sample and obtain an undercut cross-section.

The sample rotation system further includes a positioning unit 18 (although the positioning unit is positioned as shown in FIG. 5, it can be placed in any position where the sample rotation system can realize the corresponding function), and the positioning unit 18 may be a sensor or the like. The positioning unit 18 is electrically connected to the processing device 17, and the positioning unit 18 is configured to position the free end of the second carrier 5, such that the rotation device 1 can be accurately moved to the predetermined position. The first carrier 11 and the second carrier 5 are arranged correspondingly, to transfer the sample.

In the sample rotation system in the present disclosure, the second carrier is connected to the sample, the second carrier transfers the sample to the first carrier, and the rotation device rotates the sample, such that the side of the sample to be observed faces upward. The first carrier moves the sample back to the second carrier, and the cross-section processing is performed through the FIB on the machine table, to obtain the undercut cross-section. The undercut cross-section has a large observation area, which meets the basic requirements of observation and testing, and facilitates partial observation of the sample.

Figure 6:
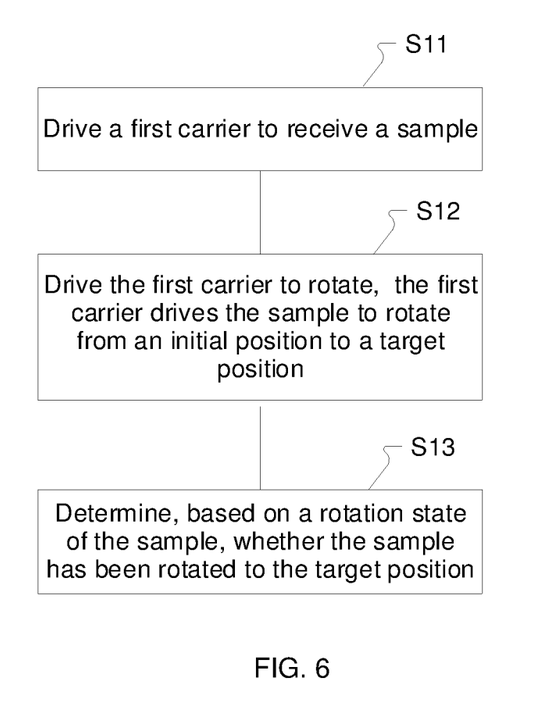
FIG. 6 is a flowchart of a sample rotation method according to an exemplary embodiment.

An exemplary embodiment of the present disclosure provides a sample rotation method, which may be applied to a sample rotation system, and the sample rotation system includes a rotation device. As shown in FIG. 6, FIG. 6 is a flowchart of the sample rotation method according to the exemplary embodiment of the present disclosure.

S11: Drive a first carrier to receive a sample.

In this step, the first carrier 11 is driven to receive the sample, such that the first carrier 11 is connected to the sample. The first carrier 11 may be adhesively connected to the sample, and a deposition process may be adopted to adhesively connect the first carrier 11 to the sample, such that the connection between the first carrier 11 and the sample is more reliable.

S12: Drive the first carrier to rotate, such that the first carrier drives the sample to rotate from an initial position to a target position.

In this step, after the first carrier 11 is stably connected to the sample, a drive portion 12 drives the first carrier 11 to rotate, and the first carrier 11 drives the sample to rotate from the initial position to the target position. The drive portion 12 drives the first carrier 11 to rotate, which realizes rapid turnover, reduces sample rotation time, improves the accuracy of sample rotation, and improves the efficiency.

There is a preset included angle between the initial position and the target position, and the preset included angle ranges between 0° and 180°.

S13: Determine, based on a rotation state of the sample, whether the sample has been rotated to the target position.

In this step, whether the sample has been rotated to the target position is determined based on the rotation state of the sample. An acquisition device 13 of the rotation device 1 acquires a current position of the sample, and transmits the acquisition result to a processing device 17. The processing device 17 determines and analyzes the result to determine whether the current position of the sample is the target position. If it is determined that the sample has been rotated to the target position, the rotation action ends. If it is determined that the sample has not been rotated to the target position, the processing device 17 may send a corresponding instruction to the control unit 14. The control unit 14 drives the drive portion 12 according to the instruction, to adjust the position of the sample in time, so as to ensure that the sample is rotated to the target position.

In the sample rotation method in this embodiment, the first carrier is driven to rotate, and the first carrier drives the sample to rotate, such that the side of the sample to be observed faces upward, facilitating cross-section processing and undercutting. The first carrier is driven by the drive portion, which improves the accuracy of sample rotation and reduces the sample rotation time. The rotation time can be shortened to less than 30 min/EA, which improves the efficiency and reduces test costs.

Figure 7:
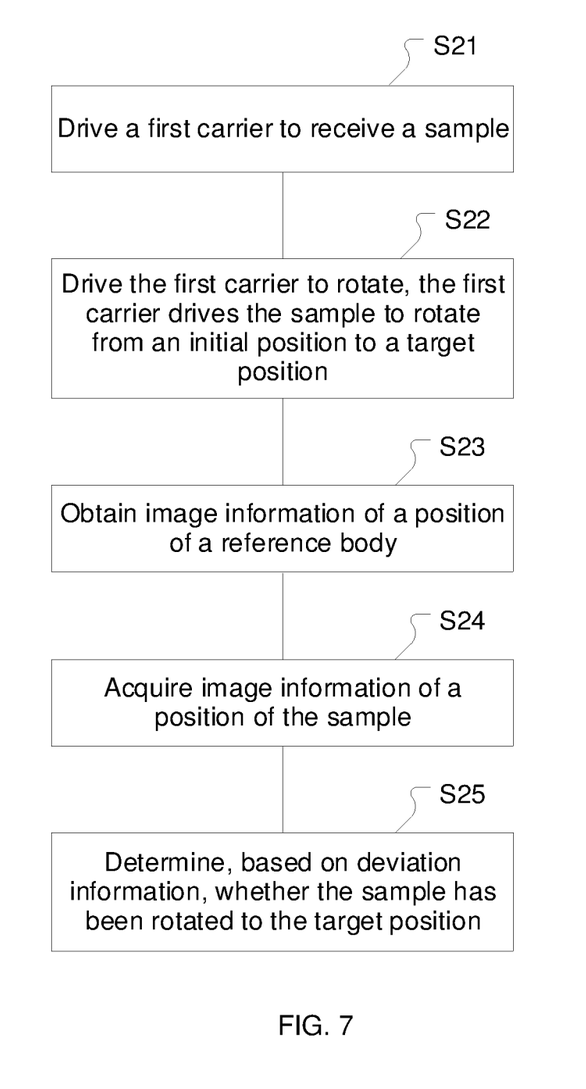
FIG. 7 is a flowchart of a sample rotation method according to an exemplary embodiment.

An exemplary embodiment of the present disclosure provides a sample rotation method, which may be applied to a sample rotation system, and the sample rotation system includes a rotation device. As shown in FIG. 7, FIG. 7 is a flowchart of the sample rotation method according to the exemplary embodiment of the present disclosure.

S21: Drive a first carrier to receive a sample.

S22: Drive the first carrier to rotate, such that the first carrier drives the sample to rotate from an initial position to a target position.

Step S21 and step S22 are the same as step S11 and step S12 in the foregoing embodiment, which have been described in detail in the foregoing embodiment, and will not be repeated here.

S23: Obtain image information of a position of a reference body.

In this step, an acquisition device 13 may acquire the image information of the position of the reference body 2. The acquisition device 13 may include an image acquisition unit, the image acquisition unit may be a camera module, and the camera module takes pictures of a current stage 15 to obtain the image information of the current position of the reference body 2.

S24: Acquire image information of a position of the sample.

In this step, when the acquisition device 13 takes pictures of the current stage 15, the sample and the reference body 2 are in the same image, and the acquisition device 13 can also capture the image information of the current position of the sample.

S25: Determine, based on deviation information between the image information of the position of the reference body and the image information of the position of the sample, whether the sample has been rotated to the target position.

In this step, a processing device 17 receives the image information of the position of the sample and the image information of the position of the reference body 2 that are acquired by the acquisition device 13. The reference body 2 is used as a reference object, and the image information of the position of the sample is compared with the image information of the position of the reference body 2 to determine the deviation information. Whether the sample has been rotated to the target position is finally determined based on the deviation information.

When the deviation information is less than or equal to a preset threshold, it is determined that the sample has been rotated to the target position, and the rotation action ends. When the deviation information is greater than a preset threshold, it is determined that the sample has not been rotated to the target position.

When the sample has not been rotated to the target position, the processing device 17 sends a corresponding instruction to the control unit 14. The control unit 14 executes the instruction to control operation of the drive portion 12, the drive portion 12 drives the first carrier 11 to continue to rotate, and the rotation action ends until the first carrier 11 drives the sample to rotate to the target position.

According to the method in this embodiment, the reference body is disposed, and the current position of the sample is directly determined with reference to the reference body. The determining method is relatively simple and intuitive, and the processing device 17 can quickly determine the current position of the sample and draw conclusions, thereby reducing the determining time and improving the efficiency.

Figure 8:
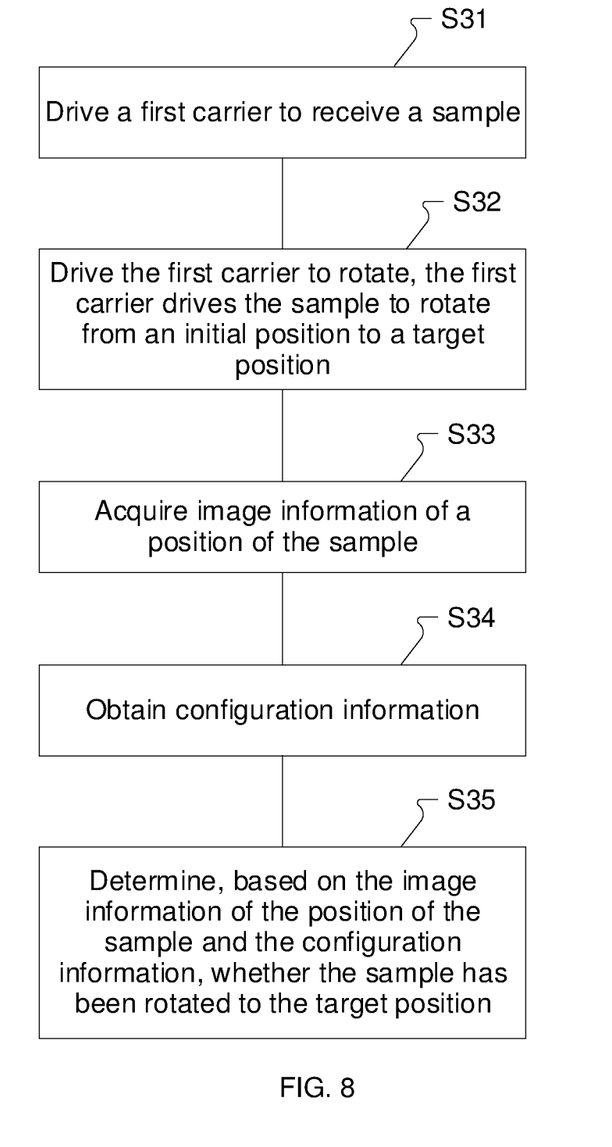
FIG. 8 is a flowchart of a sample rotation method according to an exemplary embodiment.

An exemplary embodiment of the present disclosure provides a sample rotation method, which may be applied to a sample rotation system, and the sample rotation system includes a rotation device. As shown in FIG. 8, FIG. 8 is a flowchart of the sample rotation method according to the exemplary embodiment of the present disclosure.

S31: Drive a first carrier to receive a sample.

S32: Drive the first carrier to rotate, such that the first carrier drives the sample to rotate from an initial position to a target position.

S33: Acquire image information of a position of the sample.

Step S31 to step S33 are the same as step S21, step S22, and step S24 in the foregoing embodiment, which have been described in detail in the foregoing embodiment, and will not be repeated here.

S34: Obtain configuration information, where the configuration information is used to represent a correspondence between a reference marking point of a reference unit and a target position.

In this step, the configuration information is pre-stored in the reference unit, and the configuration information is used to represent the correspondence between the reference marking point of the reference unit 3 and the target position. Each reference point corresponds to one reference value, and the target position has a target reference value.

S35: Determine, based on the image information of the position of the sample and the configuration information, whether the sample has been rotated to the target position.

In this step, an acquisition device 13 acquires the current position of the sample, to determine a reference point corresponding to the current position of the sample, and determine a reference value corresponding to the reference point. The processing device 17 compares the corresponding reference value with the reference value of the target position, to determine a deviation. If the deviation is within a preset range, it is determined that the sample has been rotated to the target position. If the deviation exceeds a preset range, it is determined that the sample has not been rotated to the target position.

According to the method in this embodiment, the reference unit is disposed, the multiple reference points are used as the reference datum, and the reference points have corresponding reference values. In this case, after the current position of the sample is accurately determined, the deviation between the current position and the target position of the sample is determined, and automatic adjustment is performed to realize automation of the sample rotation system.

Figure 9:
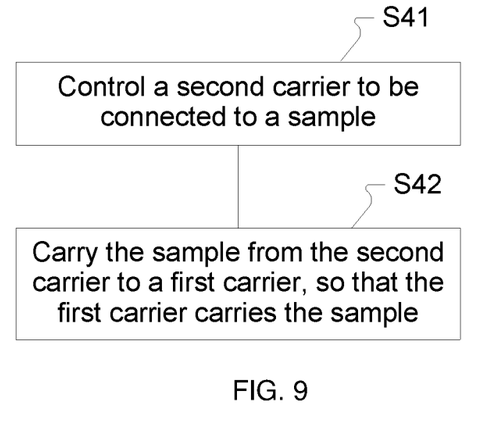
FIG. 9 is a flowchart of a sample rotation method according to an exemplary embodiment.

An exemplary embodiment of the present disclosure provides a sample rotation method, which may be applied to a sample rotation system, and the sample rotation system includes a rotation device, a second carrier and a machine table. As shown in FIG. 9, FIG. 9 is a flowchart of the sample rotation method according to the exemplary embodiment of the present disclosure.

S41: Control the second carrier to be connected to a sample.

In this step, a processing device 17 sends an instruction to the control unit 14, and the control unit 14 controls the second carrier 5 to be connected to the sample. The second carrier 5 may be adhesively connected to the sample, and a deposition process may be adopted to adhesively connect the second carrier 5 to the sample, such that the connection between the second carrier 5 and the sample is more reliable.

S42: Carry the sample from the second carrier to a first carrier, such that the first carrier carries the sample.

In this step, the processing device 17 sends the instruction to the control unit 14, the control unit 14 controls the first carrier 11 to receive the sample. The sample is carried from the second carrier 5 to the first carrier 11, such that the first carrier 11 carries the sample.

Figure 10:
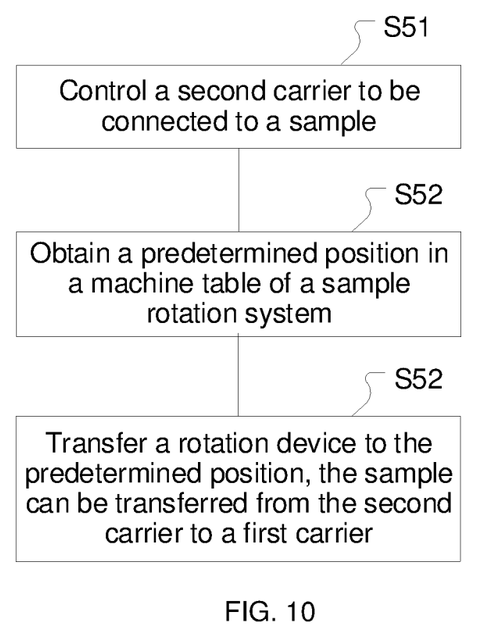
FIG. 10 is a flowchart of a sample rotation method according to an exemplary embodiment.

An exemplary embodiment of the present disclosure provides a sample rotation method, which may be applied to a sample rotation system, and the sample rotation system includes a rotation device, a second carrier and a machine table. As shown in FIG. 10, FIG. 10 is a flowchart of the sample rotation method according to the exemplary embodiment of the present disclosure.

S51: Control the second carrier to be connected to a sample.

Step S51 is the same as step S41 in the foregoing embodiment, which has been described in detail in the foregoing embodiment, and will not be repeated here.

S52: Obtain a predetermined position of the sample rotation system in the machine table.

In this step, a positioning unit 18 positions a free end of the second carrier 5, and the predetermined position is at the free end of the second carrier 5, such that a processing device 17 determines the predetermined position.

S53: Transfer the rotation device of the sample rotation system to the predetermined position, such that the sample can be transferred from the second carrier to a first carrier, and the first carrier carries the sample.

In this step, the processing device 17 sends an instruction to the control unit 14. The control unit 14 controls operation of a transfer mechanism 4, and the transfer mechanism 4 transfers the rotation device 1 to the predetermined position. A free end of the first carrier 11 approximates the free end of the second carrier 5, such that the sample can be transferred from the second carrier 5 to the first carrier 11, and the first carrier 11 carries the sample, thereby completing the sample transfer.

Figure 11:
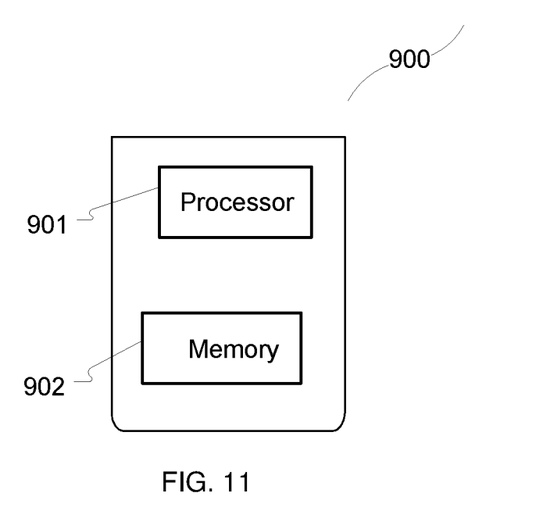
FIG. 11 is a block diagram of a computer device according to an exemplary embodiment.

FIG. 11 is a block diagram of a computer device 900 for a sample rotation system according to an exemplary embodiment. For example, the computer device 900 may be provided as a sample rotation system. Referring to FIG. 9, the computer device 900 may include a processor 901, and one or more processors may be set as required. The computer device 900 may further include a memory 902 configured to store an executable instruction, such as an application program, of the processor 901. One or more memories may be set as required. The memory may store one or more application programs. The processor 901 is configured to execute the instruction to perform the foregoing method.

Persons skilled in the art should understand that the embodiments of the present disclosure may be provided as a method, an apparatus (device), or a computer program product. Therefore, the present disclosure may use a form of hardware only examples, software only examples, or examples with a combination of software and hardware. Moreover, the present disclosure may be in a form of a computer program product that is implemented on one or more computer-usable storage media that include computer-usable program code. The computer storage media include volatile and non-volatile, removable and non-removable media implemented in any method or technology for storing information (such as computer-readable instructions, data structures, program modules, or other data), including but not limited to, a random access memory (RAM), a read only memory (ROM), an electrically erasable programmable read-only memory (EEPROM), a flash memory or other storage technologies, a CD-ROM, a digital versatile disk (DVD) or other optical disc storage, a magnetic cassette, a magnetic tape, magnetic disk storage or other magnetic storage apparatuses, or any other medium that can be used to store desired information and can be accessed by a computer. In addition, as is well known to persons skilled in the art, the communication media usually contain computer-readable instructions, data structures, program modules, or other data in modulated data signals such as carrier waves or other transmission mechanisms, and may include any information transfer medium.

In an exemplary embodiment, a non-transitory computer-readable storage medium including instructions is provided, for example, the memory 902 including instructions. The foregoing instructions may be executed by the processor 901 of the computer device 900 to complete the foregoing method. For example, the non-transitory computer-readable storage medium may be a ROM, a RAM, a CD-ROM, a magnetic tape, a floppy disk, an optical data storage device, or the like.

A non-transitory computer-readable storage medium is provided. When executed by a processor of a sample rotation system, an instruction in the storage medium enables the sample rotation system to perform the following steps:

controlling a first carrier to receive a sample; driving the first carrier to rotate, such that the first carrier drives the sample to rotate from an initial position to a target position; acquiring a rotation state of the sample; determining, based on the rotation state of the sample, whether the sample has been rotated to the target position.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, such that a series of operations and steps are performed on the computer or the another programmable device, thereby generating computer-implemented processing. Therefore, the instructions executed on the computer or the another programmable device provide steps for implementing a function specified in one or more processes in the flowcharts and/or in one or more blocks in the block diagrams.

In the present disclosure, the terms "include", "comprise", or any other variations thereof are intended to cover a non-exclusive inclusion, such that an article or a device including a series of elements not only includes those elements, but also includes other elements that are not explicitly listed, or also includes inherent elements of the article or the device. Without more restrictions, the elements defined by the statement "including a . . . " do not exclude the existence of other identical elements in the article or device including the elements.

Although some preferred embodiments of the present disclosure have been described, persons skilled in the art can make changes and modifications to these embodiments once they learn the basic inventive concept. Therefore, the appended claims are intended to be interpreted as including the preferred embodiments and all changes and modifications falling within the scope of the present disclosure.

Apparently, persons skilled in the art can make various changes and modifications to the present disclosure without departing from the spirit and scope of the present disclosure. In this way, if these changes and modifications to the present disclosure fall within the scope of the claims of the present disclosure and equivalent technologies thereof, the present disclosure is further intended to include these changes and modifications.

Each embodiment or implementation in the specification is described in a progressive manner. Each embodiment focuses on the difference from other embodiments, and the same and similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the sample rotation system and the sample rotation method provided in the embodiments of the present disclosure, the second carrier is connected to the sample, the second carrier transfers the sample to the first carrier, and the rotation device rotates the sample, such that a side of the sample with the curtaining effect is exposed. The first carrier moves the sample back to the second carrier, and the cross-section processing is performed through the FIB on the machine table, to obtain the undercut cross-section. The undercut cross-section has a large observation area, which meets the basic requirements of observation and testing, and facilitates partial observation of the sample.

The invention claimed is:

1. A sample rotation system, wherein the sample rotation system comprises a rotation device, and the rotation device comprises:
   a first carrier, configured to be connected to a sample;
   a drive portion, connected to the first carrier, wherein the drive portion is configured to drive the first carrier to rotate, and the first carrier drives the sample to rotate from an initial position to a target position;
   an acquisition device, configured to acquire a rotation state of the sample; and
   a control unit, electrically connected to the drive portion, and configured to control operation of the drive portion; and, wherein
   the sample rotation system further comprises a processing device, a machine table and a transfer mechanism,
   the processing device is electrically connected to the control unit and the acquisition device, respectively, and the processing device is configured to be communicatively connected to the acquisition device, and
   the transfer mechanism is installed on the machine table, the transfer mechanism is electrically connected to the control unit, the control unit is configured to drive the transfer mechanism, and the transfer mechanism is configured to drive the rotation device to move to a predetermined position of the machine table.

2. The sample rotation system according to claim 1, wherein there is a preset included angle between the initial position and the target position, and the preset included angle ranges between 0° and 180°.

3. The sample rotation system according to claim 1, the rotation device further comprising a stage, the drive portion being installed on the stage, the first carrier being installed on the stage, and a fixed end of the first carrier being connected to the drive portion.

4. The sample rotation system according to claim 3, the rotation device further comprising a limiting portion fixedly connected to the stage, the drive portion being installed on the stage through the limiting portion, and the fixed end of the first carrier penetrating the limiting portion to be connected to the drive portion.

5. The sample rotation system according to claim 1, wherein the acquisition device comprises an image acquisition unit, the image acquisition unit is electrically connected to the processing device, and the image acquisition unit is configured to acquire image information of a position of the sample.

6. The sample rotation system according to claim 5, wherein the image acquisition unit comprises a camera module.

7. The sample rotation system according to claim 5, the sample rotation system further comprising a reference body, the reference body is arranged at the target position, and the first carrier being configured to move relative to the reference body; and
the image acquisition unit acquiring image information of a relative position between the sample and the reference body.

8. The sample rotation system according to claim 5, the sample rotation system further comprising a reference unit, the reference unit being communicatively connected to the processing device, and the reference unit comprising a multiple of reference marking points.

9. The sample rotation system according to claim 1, the sample rotation system further comprising a second carrier, and the second carrier being installed on the machine table; and the second carrier being configured to be connected to the sample and carrying the sample to the first carrier, to connect the sample to the first carrier and separating the sample from the second carrier.

10. The sample rotation system according to claim 9, the sample rotation system further comprising a positioning unit, the positioning unit being electrically connected to the processing device, and the positioning unit being configured to position a free end of the second carrier.

11. A sample rotation method, comprising:
controlling a first carrier to receive a sample;
driving the first carrier to rotate, the first carrier driving the sample to rotate from an initial position to a target position;
acquiring a rotation state of the sample; and
determining, based on the rotation state of the sample, whether the sample has been rotated to the target position; and,
wherein controlling the first carrier to receive the sample comprises:
controlling a second carrier to be connected to the sample;
obtaining a predetermined position of a machine table; and
driving, by a transfer mechanism installed on the machine table, a rotation device comprising the first carrier, to move the rotation device to the predetermined position of the machine table, so that the sample can be transferred from the second carrier to the first carrier, and the first carrier carries the sample.

12. The sample rotation method according to claim 11, wherein the determining, based on the rotation state of the sample, whether the sample has been rotated to the target position comprises:
obtaining image information of a position of a reference body;
acquiring image information of a position of the sample; and
determining, based on deviation information between the image information of the position of the reference body and the image information of the position of the sample, whether the sample has been rotated to the target position.

13. The sample rotation method according to claim 12, wherein the determining, based on the deviation information between the image information of the position of the reference body and the image information of the position of the sample, whether the sample has been rotated to the target position comprises:
when the deviation information is less than or equal to a preset threshold, determining that the sample has been rotated to the target position; or
when the deviation information is greater than the preset threshold, determining that the sample has not been rotated to the target position.

14. The sample rotation method according to claim 13, further comprising:
when the sample has not been rotated to the target position, controlling a drive portion to operate, wherein the drive portion drives the first carrier to rotate, and the first carrier drives the sample to rotate to the target position.

15. The sample rotation method according to claim 11, wherein the determining, based on the rotation state of the sample, whether the sample has been rotated to the target position comprises:
acquiring image information of a position of the sample; and
obtaining configuration information, wherein the configuration information is used to represent a correspondence between a reference marking point of a reference unit and the target position; and
determining, based on the image information of the position of the sample and the configuration information, whether the sample has been rotated to the target position.

* * * * *